United States Patent
Svizhenko et al.

(10) Patent No.: US 9,594,727 B2
(45) Date of Patent: Mar. 14, 2017

(54) OPTIMIZATION OF PARASITIC CAPACITANCE EXTRACTION USING STATISTICAL VARIANCE REDUCTION TECHNIQUE

(71) Applicant: Synopsys, Inc., Mountain View, CA (US)

(72) Inventors: Alexei Svizhenko, San Jose, CA (US); Arindam Chatterjee, Saratoga, CA (US); Joseph Gregory Rollins, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 26 days.

(21) Appl. No.: 14/579,809

(22) Filed: Dec. 22, 2014

(65) Prior Publication Data
US 2016/0180007 A1 Jun. 23, 2016

(51) Int. Cl.
G06F 9/455 (2006.01)
G06F 17/50 (2006.01)
G06F 17/18 (2006.01)

(52) U.S. Cl.
CPC .......... *G06F 17/18* (2013.01); *G06F 17/5036* (2013.01); *G06F 17/5063* (2013.01)

(58) Field of Classification Search
CPC .................................................. G06F 17/505
USPC ....................................................... 716/132
See application file for complete search history.

(56) References Cited

U.S. PATENT DOCUMENTS

| | | | |
|---|---|---|---|
| 7,103,524 B1 * | 9/2006 | Teig ..................... | G06F 17/5081 703/14 |
| 2006/0053394 A1 * | 3/2006 | Batterywala ........ | G06F 17/5081 716/115 |
| 2010/0122222 A1 * | 5/2010 | Elfadel ............... | G06F 17/5036 716/136 |
| 2010/0122223 A1 * | 5/2010 | Elfadel ............... | G06F 17/5036 716/136 |

OTHER PUBLICATIONS

Performance of Random Walk Capacitance Extractors for IC Interconnects: A Numerical Study; Iverson et al.; pp. 581-588; Solid-State Electronics vol. 42, 1998.*

(Continued)

*Primary Examiner* — Suresh Memula
(74) *Attorney, Agent, or Firm* — Bever, Hoffman & Harms, LLP

(57) ABSTRACT

A method for performing parasitic capacitance extraction of an integrated circuit (IC) design includes: defining a Gaussian surface around an origin net of the IC design; partitioning the Gaussian surface into a plurality of regions; performing an initial plurality of random walks from each region using a Monte Carlo field solver; and dynamically allocating an additional plurality of random walks among the plurality of regions, wherein the allocation is based on statistical errors associated with the initial plurality of random walks for each of the regions. Results from the random walks are averaged to estimate parasitic capacitance of the origin net. The method may include performing the random walks for each region in pairs, wherein a first random walk of the pair is selected in accordance with an anti-symmetric probability function, and a second random walk of the pair is antithetic to the first random walk of the pair.

35 Claims, 6 Drawing Sheets

(56) References Cited

OTHER PUBLICATIONS

A Statistical Algorithm for 3-D Capacitance Extraction; Brambilla et al.; pp. 304-306; IEEE Microwave and Guided Wave Letters vol. 10, No. 8; Aug. 2000.*

Yu, Wenjian, et al., "RWCap: A Floating Random Walk Solver for 3-D Capacitance Extraction of Very-Large Scale Integration Interconnects", IEEE, vol. 32, No. 3, Mar. 2013, 14 pages.

Le Coz, Y.L. et al., "A Stochastic Algorithm for High Speed Capacitance Extraction in Integrated Circuits", Solid-State Electronics, vol. 35, No. 7, pp. 1005-1012 (8 pages), 1992.

* cited by examiner

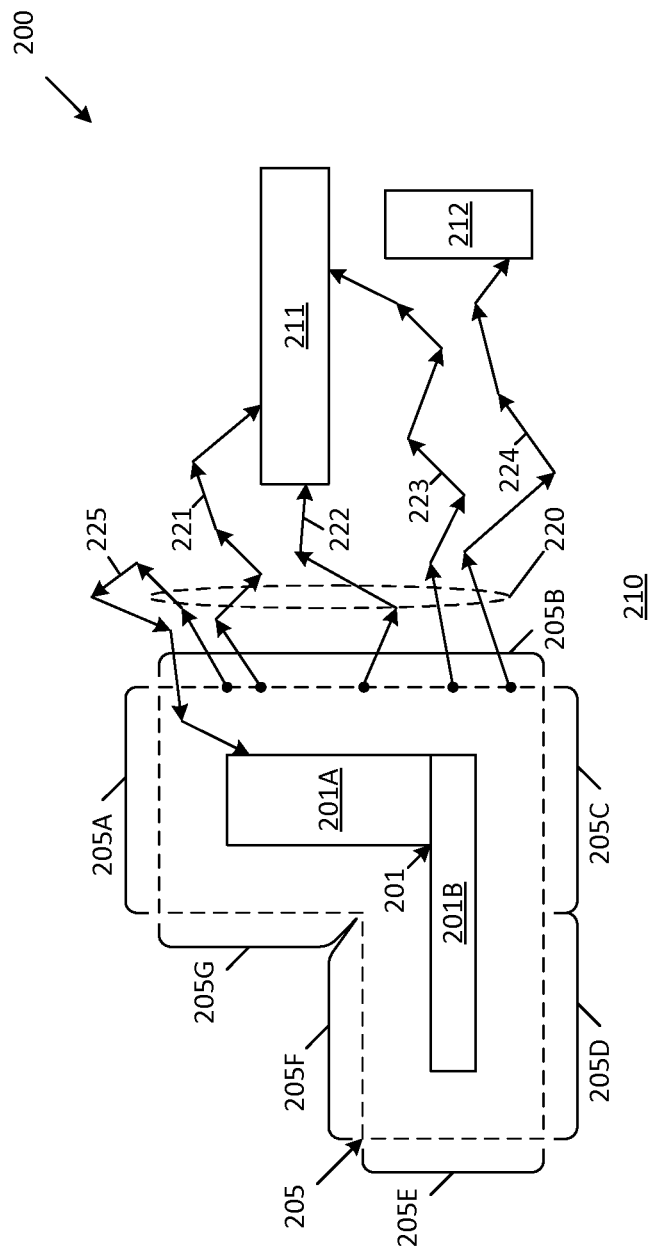

OPTIMIZATION OF PARASITIC CAPACITANCE EXTRACTION USING STATISTICAL VARIANCE REDUCTION TECHNIQUE

FIELD OF THE INVENTION

The present invention relates to the optimization of parasitic capacitance extraction in an integrated circuit (IC) design. More specifically, a parasitic capacitance extraction method for an origin net is provided, where a Gaussian surface surrounding the origin net is stratified (partitioned) into a plurality of regions, and the number of random walks performed from each region is dynamically re-allocated over multiple iterations based on statistical variances observed during previous iterations. The random walks may be performed in groups of negatively correlated (antithetic) random walks.

BACKGROUND

A field solver solves a Laplace equation in a large 3D domain of integrated circuit (IC) design, consisting of conductor nets and surrounding dielectric stacks, to find an electric field. The flux of an electric field through a closed surface around a conductor, divided by applied bias gives a parasitic coupling capacitance between the conductor and its neighbors. However, field solvers that operate based on mesh discretization methods, such as finite volume, finite element or boundary element methods, are not capable of handling the very large domain of IC design, in spite of a large amount of research. The most promising technique for parasitic capacitance extraction is a random walk Monte Carlo field solver, which relies on statistical methods to solve a Laplace equation, and does not rely on mesh discretization.

Parasitic capacitance extracted using a random walk Monte Carlo field solver is currently regarded as a gold standard and is used for validation of other, less exact models. Parasitic capacitance of some critical nets of an IC design, as well as parasitic capacitance of small IC designs (where high accuracy is important) may be extracted completely by a random walk Monte Carlo field solver, without relying on approximate models. With IC designs getting more and more complicated, it is highly desirable to use a random walk Monte Carlo field solver as the only parasitic capacitance extraction tool. The main obstacle to achieve this is the relatively poor performance of a random walk Monte Carlo field solver, compared to simpler models.

A random walk Monte Carlo field solver has been proposed by LeCoz, et al. in "A Stochastic Algorithm for High Speed Capacitance Extraction in Integrated Circuits", Solid State Electronics, 35, 1992, pp. 1005-1012. FIG. 1 is a block diagram illustrating steps conventionally used by a random walk Monte Carlo field solver to determine the parasitic capacitance of an origin net 101 of an IC design 100. First, a closed Gaussian surface 105 is created around an origin net (conductor) 101 whose parasitic capacitance is to be extracted. A point P1 is then chosen randomly on the Gaussian surface 105, and a cube 111 is built with the center at the location of point P1, such that there is no metal present inside the cube 111. An edge of the cube 111 may coincide with an edge of the origin net 101 as illustrated by FIG. 1, although this is not necessary. The value of the weight of the random walk is determined by the size of the cube 111 and a dielectric constant at the point P1. Using a probability distribution function, a new point P2 on the surface of the cube 111 is sampled randomly. This probability distribution function uses the absolute value of the normalized Green's function of the normal component of an electric field for Laplace equation in the cube 111. This probability distribution function is hereinafter referred to as the electric field Green's function. The sign of the value provided by the electric field Green's function determines the sign of the weight of the random walk. A new cube 112 is built with the center at the location of point P2, such that there is no metal present inside the cube 112 (but there is metal (e.g., target net 123) present at an edge of the cube 112). Using a probability distribution function, a new point P3 on the surface of the cube 112 is chosen randomly. This probability distribution function uses the electrostatic potential Green's function of Laplace equation in the cube 112. This probability function is hereinafter referred to as the electrostatic potential Green's function. The last step, which requires the electrostatic potential Green's function, is repeated, until a new point is located on a surface of a metal. In the illustrated example, cube 113 (which shares an edge with target net/conductor 121) is formed around point P3, point P4 is randomly selected on cube 113, cube 114 (which shares an edge with target net/conductor 122) is formed around point P4, and point P5 is randomly selected on cube 114, wherein point P5 is located on a surface of target net conductor 122, thereby ending the random walk. The weights of random walks terminated on all conductors (e.g., target nets 121-123) are multiplied by 1 Volt, except for those terminated on the originating conductor (origin net 101) which are multiplied by 0 Volts and thus are discarded. Each of the weights is added as a contribution to a first sum, and the square of each of the weights is added to a second sum. The first sum, averaged over all random walks is the mean value of the coupling capacitance (hereinafter referred to as "the mean value") between origin net 101 and target nets 122-123. The second sum, averaged over all walks and subtracted from the mean value squared provides a sample variance of the coupling capacitance (hereinafter referred to as "the sample variance"). A sample variance is a statistical approximation to the true variance, which is an unknown constant characterizing the population of random walks. As the simulation progresses, the sample variance, while changing its value, becomes a better and better approximation and eventually converges to the true variance. The manner in which the random walks are performed may strongly affect the value of the true and sample variances. The sample variance divided by the number of walks is the variance of the mean value. The square root of the variance of the mean value is the standard deviation of the mean value. The statistical error of the mean value is the standard deviation of the mean value divided by the mean value. As the number of random walks increases, the statistical error of the mean value, the variance of the mean value and the standard deviation of the mean value converge to a zero value, thus improving a confidence in the mean value of the coupling capacitance. The rate of the convergence depends on the value of the sample variance, i.e. on the manner the random walks are performed.

The simulation is done iteratively, with an equal number of random walks spent on each iteration, and the statistical error of the mean value being computed at the end of each iteration. The simulation continues until the statistical error of coupling capacitance to each neighboring net decreases sufficiently to meet a certain accuracy goal. When the accuracy goal is met, the coupling capacitance is said to be converged. Although the statistical error is used to check the accuracy goal, analogous convergence goals can be established for variance of the mean value or standard deviation of the mean value. Minimizing any one of these three quantities, will also minimize the other two.

The runtime of the process described above depends on the statistical variance of the mean value of the coupling capacitance and is directly proportional to the number of random walks.

The performance of the above-described random walk Monte Carlo field solver is poor (slow) because many random walks are inevitably performed from low-error/low-contribution areas of the Gaussian surface 105. The performance of the above-described random walk Monte Carlo field solver is also poor because a relatively large number of the random walks are inevitably performed to determine the coupling capacitances of nearby neighboring nets (conductors) that have already converged. At the same time, the random nature of the walks ensures that high-error/high-contribution areas do not get sufficient coverage. That is, a relatively small number of the random walks are performed to determine the coupling capacitances that have not yet converged.

The conventional random walk Monte Carlo field solver also exhibits poor performance due to the fact that the mean value of the coupling capacitance is composed of both positive and negative contributions of random walks (due to the positive and negative signs provided by the electric field Green's function). These positive and negative contributions can result in a convergence that is slow and oscillatory, particularly when the mean value of the coupling capacitance is very small.

It would therefore be desirable to have a method and structure that solves the problem of poor performance of parasitic capacitance extraction using a conventional random walk Monte Carlo field solver.

SUMMARY

Accordingly, the present invention provides improved methods for using a random walk Monte Carlo field solver for determining the parasitic capacitance associated with an origin net of a three-dimensional (3D) integrated circuit design.

In accordance with one embodiment, a method for performing parasitic capacitance extraction of an integrated circuit (IC) design includes: defining a Gaussian surface around an origin net of the IC design; partitioning the Gaussian surface into a plurality of regions; performing an initial plurality of random walks from each region using a Monte Carlo field solver; and dynamically allocating an additional plurality of random walks among the plurality of regions, wherein the allocation is based on statistical errors associated with the initial plurality of random walks for each of the regions. Results from the random walks are averaged to estimate the parasitic capacitance of the origin net.

The additional plurality of random walks are allocated among the plurality of regions such that different regions may be allocated different numbers of random walks. In one embodiment, the number of the additional plurality of random walks allocated to a region is based on a statistical error (e.g., standard deviation) associated with the initial plurality of random walks performed from the region. The number of additional plurality of random walks allocated to a region increases as the statistical error associated with the initial plurality of random walks performed from the region increases. In a particular embodiment, the number of the additional plurality of random walks allocated to each region is proportional to the standard deviation associated with the initial plurality of random walks performed from the region, divided by the sum of the standard deviations associated with the initial plurality of random walks performed from all of the regions.

Multiple iterations can be performed, wherein in each iteration, an additional plurality of random walks are allocated among the plurality of regions in the manner described above.

In accordance with an alternate embodiment, a method for performing parasitic capacitance extraction of an integrated circuit (IC) design includes: defining a Gaussian surface around an origin net of the IC design; using a Monte Carlo field solver, performing pairs of random walks from the Gaussian surface, wherein each pair of random walks includes: a first random walk having a first weight and a first associated sign defined by a probability function; and a second (antithetic) random walk having the first weight and a second associated sign, opposite the first associated sign, defined by the probability function. When the first random walk and the antithetic second random walk end on the same conductor of the IC design, an average contribution of the first random walk and the second random walk to a mean value of a parasitic capacitance and a variance of the mean value of the parasitic capacitance are determined to be zero. In one embodiment, the probability function is anti-symmetric with respect to the Gaussian surface, and may be implemented by the electric field Green's function.

In accordance with yet another embodiment, a method for performing parasitic capacitance extraction of an integrated circuit (IC) design includes: defining a Gaussian surface around an origin net of the IC design; using a Monte Carlo field solver, performing a plurality of groups of walks from the Gaussian surface, wherein each group of walks includes two or more walks having weights and signs selected such that the average weight of the walks of each group is approximately zero. In this embodiment, the each group of walks can be said to include an antithetic set of walks.

In accordance with various embodiments, the above described methods can be used independently or combined. Dynamically allocating the random walks and performing the random walks in antithetic groups in the above described manners advantageously reduces the values of the true and sample variances, thereby improving the performance (e.g., convergence speed) of the random walk Monte Carlo field solver.

In various embodiments, a computer readable medium stores instructions, which when executed, cause a computer to perform the above-described methods.

The present invention will be more fully understood in view of the following description and drawings.

BRIEF DESCRIPTION OF THE DRAWINGS

FIGS. 2A and 2B are block diagrams of an IC design, and a process used by a random walk Monte Carlo field solver to determine a parasitic capacitance of an origin net of the IC design, in accordance with one embodiment of the present invention.

DETAILED DESCRIPTION

In general, the present invention includes two methods for reducing the statistical variance of a random walk Monte Carlo field solver when determining the parasitic capacitance of an origin net of an integrated circuit design, thereby significantly improving the performance of the random walk Monte Carlo field solver.

Statistical variance reduction is achieved through a first method that implements stratified sampling with optimal allocation, and/or a second method that implements antithetic random walks.

In accordance with the first method, a Gaussian surface around an origin net being extracted is stratified (partitioned) into a plurality of regions and the number of random walks from each of the regions is dynamically allocated over a plurality of iterations. As described in more detail below, the first method employs minimization of the total variance of the calculated parasitic capacitance.

In accordance with the second method, for each random walk, an antithetic walk (having the same probability and magnitude, but an opposite sign) is launched. As described in more detail below, the second method employs the anti-symmetry of Green's function to reduce the oscillation of the calculated parasitic capacitance, thereby reducing the time required for the mean value of the parasitic capacitance to converge.

First Method

Figure 2B:
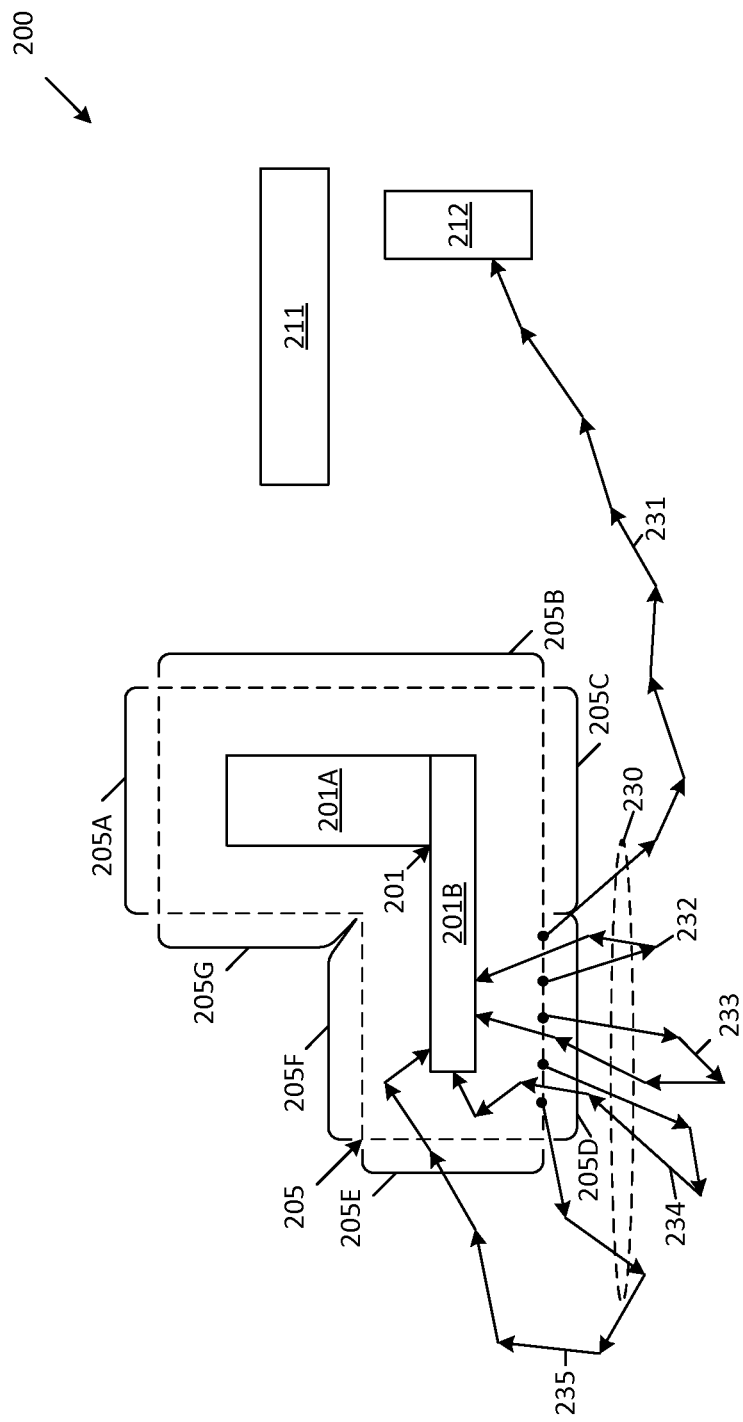

FIGS. 2A and 2B are block diagrams of an IC design 200, and illustrate a process used by a random walk Monte Carlo field solver to determine a parasitic capacitance of an origin net 201 of the IC design 200, in accordance with one embodiment of the present invention.

Figure 3:
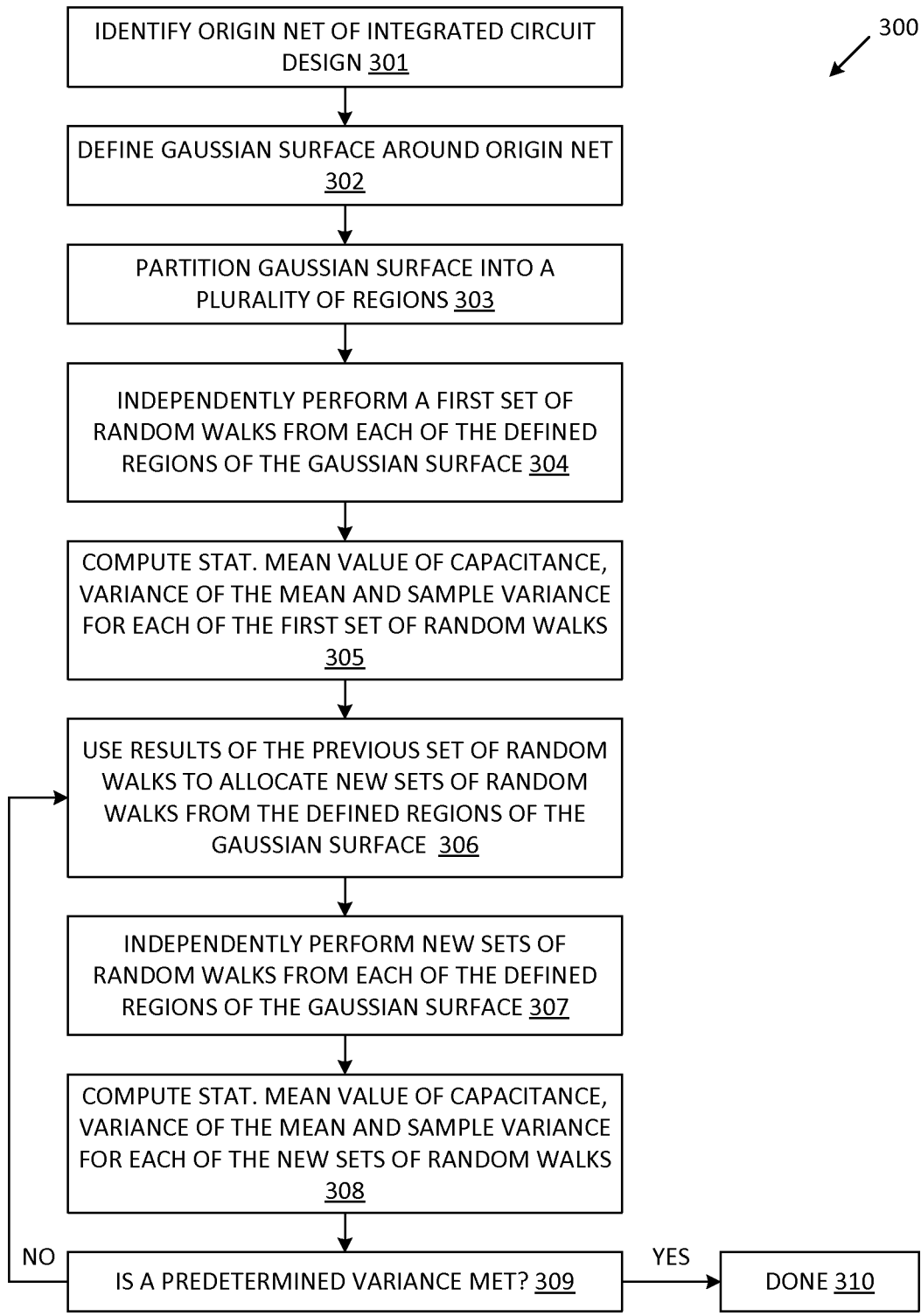
FIG. 3 is a flow diagram illustrating steps of a method used by a random walk Monte Carlo field solver to determine a parasitic capacitance of an origin net of an IC design, in accordance with one embodiment of the present invention.

FIG. 3 is a flow diagram 300 illustrating steps of a process used to control a random walk Monte Carlo field solver to determine a parasitic capacitance of an origin net of the IC design, in accordance with one embodiment of the present invention.

IC design 200 includes an origin net (conductor) 201 and targets nets (conductors) 211-212. One or more dielectric materials 210 are located between origin net 201 and target nets 211-212. Although only two target nets 211-212 are illustrated in FIGS. 2A-2B, it is understood that other numbers of target nets may be present in IC design 200. In the illustrated example, origin net 201 includes two conductive (metal) elements 201A and 201B, which are in electrical contact. In other embodiments, origin net 201 (and target nets 211-212) can include other numbers of conductive (metal) elements, and can have other shapes and sizes.

In accordance with one embodiment, the origin net 201 of the IC design 200 is initially identified (step 301). A Gaussian surface 205 is then defined around the origin net 201 (step 302). In general, the Gaussian surface 205 is a closed three-dimensional surface surrounding the origin net 201. The Gaussian surface 205 of the origin net 201 is then stratified (i.e. partitioned) into a plurality of regions 205A-205G (step 303). In the illustrated example, regions 205C and 205D share a common plane of the Gaussian surface 205. Although the illustrated example shows each of the regions 205A-205G on a corresponding plane of the Gaussian surface, it is understood that the regions may be selected in other manners in other embodiments. For example, non-continuous portions of the Gaussian surface 205 (e.g., regions 205E and 205G) may combine to form a 'region' of the Gaussian surface 205. Similarly, continuous non-planar portions of the Gaussian surface 205 (e.g., continuous portions of regions 205A and 205B) may combine to form a 'region' of the Gaussian surface 205.

Figure 1:
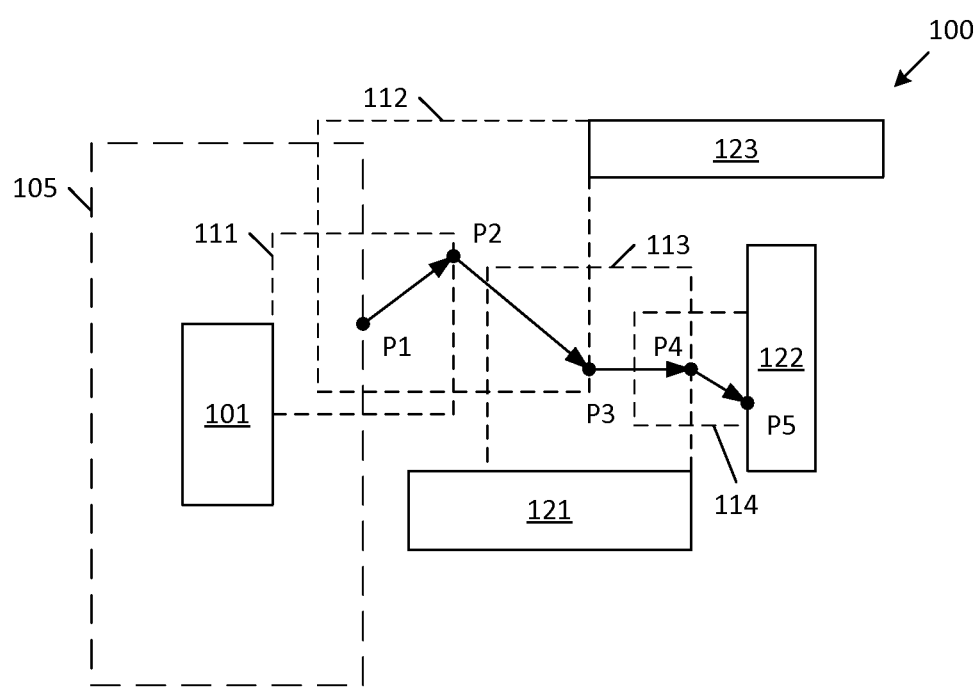
FIG. 1 is a block diagram illustrating steps conventionally used by a random walk Monte Carlo field solver to determine the parasitic capacitance of an origin net of an IC design.

A random walk Monte Carlo field solver then independently performs a random walk simulation for each of the partitioned regions 205A-205G (step 304). In one embodiment, each of these random walks is performed in the manner described above in connection with FIG. 1. As illustrated by FIG. 2A, a first set 220 of N random walks 221-225 is initially performed from region 205B of Gaussian surface 205. As illustrated by FIG. 2B, a second set 230 of N random walks 231-235 is initially performed from region 205D of Gaussian surface 205. N random walks (not shown) are similarly performed from each of the remaining regions 205A, 205C and 205E-205G. Although only five random walks (N=5) are illustrated from each of the regions 205B and 205D, it is understood that other numbers of initial random walks can be performed in other embodiments. In another embodiment, a predetermined total number of M initial random walks are evenly distributed over the defined regions 205A-205G. In yet another embodiment, each of the regions 205A-205G may be allocated different numbers of the M initial random walks. For example, each of the regions 205A-205G may be allocated an initial number of random walks that is directly proportional to an area of the region. In an alternate embodiment, each of the regions 205A-205G may be allocated an initial number of random walks that is directly proportional to an area of the region divided by a distance between the region and a nearest target net of the IC design 200.

The initial random walks performed for each region are used to calculate the statistical mean value of the parasitic capacitance (hereinafter referred to as "the mean value"), the variance of the mean value, and the sample variance for the region (step 305). In accordance with one embodiment, these calculations are performed for each region in the manner described above in connection with FIG. 1. As illustrated by FIG. 2A, the set 220 of random walks 221-225 performed from region 205B include: random walks 221-223, which end on target net 211, random walk 225, which ends on target net 212 and random walk 225, which ends on origin net 201. As illustrated by FIG. 2B, the set 230 of random walks 231-235 performed from region 205D include: random walk 231, which ends on target net 212, and random walks 232-235, which end on origin net 201. The random walks 221-225 performed from region 205B will therefore exhibit a higher statistical mean value of parasitic capacitance, and a higher variance of the mean value, than the random walks 231-235 performed from region 205D. Stated another way, the random walks 221-225 from region 205B provide a larger contribution to the total parasitic capacitance calculation than the random walks 231-235 performed from region 205D.

The results obtained from the initial sets of random walks are used to dynamically allocate new sets of random walks to each of the regions 205A-205G of the Gaussian surface 205 for a subsequent iteration (step 306).

Over multiple iterations, the sample variance of each region will converge to a corresponding constant value (i.e., the true variance). Assuming that the sample variance of each region remains nearly constant from iteration to iteration, the variance of the mean value of the region, being the ratio of the sample variance of the region to the number of walks performed from the region, can be approximately projected to the next iteration. The value of the variance of the mean value for a region at the next iteration is approximated to be equal to the mean value of the region at the current iteration multiplied by the ratio of the total number of random walks that have been performed from the region at the current iteration to the total number of random walks that will have been performed from the region at the next iteration. The projected values of variance of the mean value of each region are summed to obtain the total variance of the mean value of the parasitic coupling capacitance of the net (hereinafter referred to as "the total variance"). The total variance is minimized with respect to the number of random walks allocated to each region at the next iteration under a constraint that the total number of random walks from all regions for the next iteration is fixed at a predetermined number, M. In the described embodiments, each iteration includes the same predetermined number of random walks, M. However, in other embodiments, the number of random walks can be different for various iterations.

In accordance with one embodiment, the optimized number of random walks allocated to a particular region at the next iteration is selected to be proportional to the standard deviation of the mean value of that region at the current iteration. In a particular embodiment, the number of random walks allocated to a region for a subsequent iteration is equal to: the fixed total number of random walks apportioned for the subsequent iteration (M), multiplied by the standard deviation of the mean value of capacitance of the region for the current iteration, divided by the sum of the standard deviations of the mean values of capacitance of all of the regions for the current iteration. In this manner, each of the regions 205A-205G obtains an optimal number of random walks required to minimize the total variance of the mean value of the coupling capacitance of the net during the subsequent iteration. In the example illustrated by FIGS. 2A and 2B, during a second iteration of random walks, a larger number of random walks will be assigned to region 205B and a smaller number of random walks will be assigned to regions 205D, based on the results of the first sets of random walks 220 and 230.

The random walk Monte Carlo field solver then independently performs a random walk simulation for each of the partitioned regions 205A-205G, using the dynamically re-allocated number of walks for each of these regions (step 307).

The random walks performed for each region are used to calculate the statistical mean value of the parasitic capacitance, the variance of the mean value and the sample variance for each region (step 308). The calculated variances of the mean value of each region are summed to obtain the total variance of coupling capacitance of the net. The total variance of coupling capacitance of the net is compared to a predetermined variance to determine whether the calculated variance is less than the predetermined variance (step 309). If so, the process is complete, and the parasitic capacitance of the origin net 201 is set equal to the calculated mean value of the parasitic capacitance (step 310). If not, processing returns to step 306 and another iteration of random walks is performed, with dynamic allocation of the random walks being performed for each iteration in the manner described above.

As described above, the allocation of random walks is dynamically optimized for each iteration according to the standard deviation associated with each of the regions. Thus, computational resources (random walks) are dynamically reallocated from regions with small error/small contribution to regions with high error/high contribution. This method becomes very effective when only a certain portion of the origin net contributes to the parasitic capacitance.

Second Method

Figure 4:
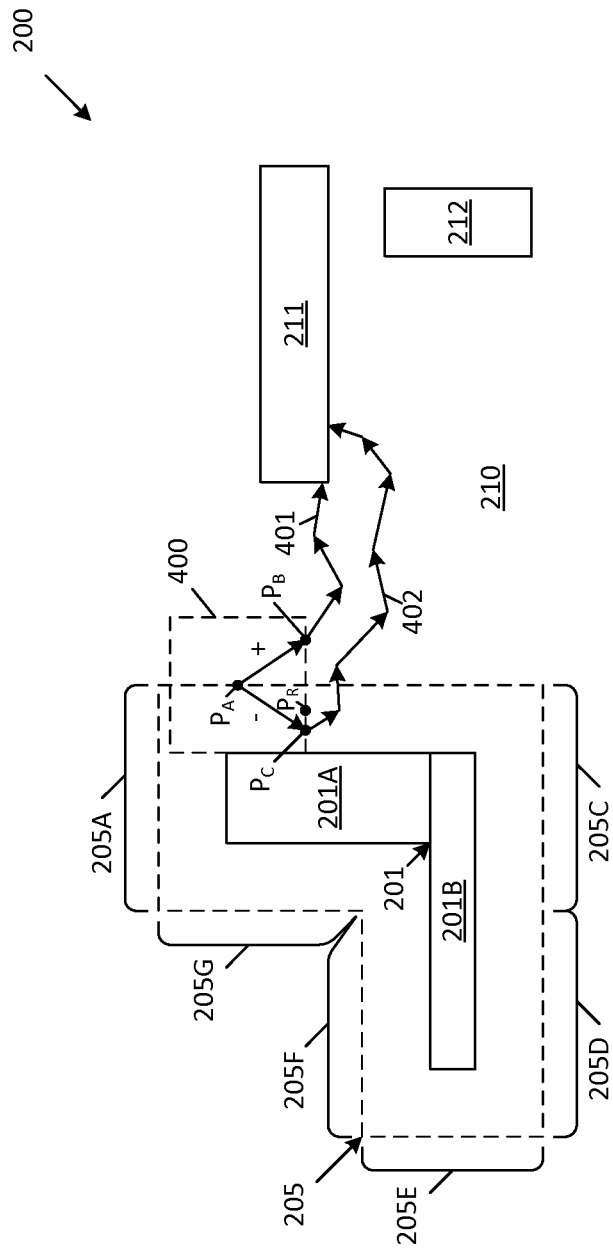
FIG. 4 is a block diagram of an IC design, and a method for implementing antithetic walks with a random walk Monte Carlo field solver in accordance with an embodiment of the present invention.

FIG. 4 is a block diagram of the IC design 200, illustrating a method for implementing antithetic walks with a random walk Monte Carlo field solver in accordance with the second embodiment of the present invention. In this embodiment, for each random walk initiated, one or more random walks, which are negatively correlated with the initial random walk, are performed. Because these one or more random walks are negatively correlated with the initial random walk, these one or more random walks are referred to as 'antithetic' random walks.

As illustrated by FIG. 4, a random walk 401 initiated from point $P_A$ of region 205B of Gaussian surface 205 randomly samples point $P_B$ of a cube 400 formed around point $P_A$ (using a random walk Monte Carlo field solver). In the simplest case, wherein the dielectric material 210 consists of a uniform dielectric stack, the electric field Green's function is used as a probability function to select the point $P_B$. The electric field Green's function is anti-symmetric, such that for each point sampled on the surface of the cube 400 there always will be a mirror-symmetrical point with the same probability and the opposite sign of the weight. In the described example, points on the cube 400 outside of the Gaussian surface 205 have a positive weight, and points on the cube 400 inside the Gaussian surface 205 have a negative weight. In the example illustrated by FIG. 4, the point $P_C$ is the mirror-symmetrical point of the point $P_B$, wherein the point $P_C$ has the same probability and weight as the point $P_B$ in accordance with the electric field Green's function. However, the weight (sign) of point $P_B$ is positive, while the weight (sign) of point $P_C$ is negative.

As illustrated by FIG. 4, an original random walk 401 proceeds from point $P_B$ of the cube 400, and ends on target net 211. The antithetic random walk 402 proceeds from point $P_C$ of the cube 400, and also ends on target net 211. Because these two random walks 401-402 end on the same conductor 211, the contribution of their average weight to the mean value of the capacitance and the variance of the mean value of the capacitance is exactly zero. This zero result advantageously allows the mean value of the capacitance to converge rapidly. This zero result also advantageously reduces the variance of the mean value of the capacitance.

The advantages of this result may be more clearly understood when compared with a method that does not use antithetic random walks. Assume, for example, that point $P_C$ is not selected as an antithetic point with respect to point $P_B$. Instead, assume that point $P_C$ is replaced with a random point $P_R$ on the cube 400, wherein the random point $P_R$ has a weight close to (but different than) the weight of point $P_C$ on the negative weight side of the cube 400. If a random walk from the random point $P_R$ ends on the same target net 211 as the original random walk 401, then the mean value of the capacitance (and the variance) associated with these two random walks will be small, but non-zero, due to the different weights assigned to these random walks. These non-zero results will cause the convergence of the mean value of the capacitance (and variance) to be slow, because these values may continually cause the mean value of the capacitance (and variance) to increase and decrease (i.e., oscillate) away from a zero result. When antithetic walks are not used, cancellation of approximately equally weighted positive and negative weighted random walks (i.e., a proper zero result) occurs only in a statistical sense, after a very long simulation. In contrast, by using antithetic random walks in the manner taught above, an exact result is advantageously obtained in just two random walks.

In an alternate embodiment, the walks for each region are performed in pairs, wherein a first random walk of each pair is selected to have a first magnitude and a first sign, and wherein a second random walk of each pair is selected to have a second magnitude and a second sign, opposite the first sign, wherein the first magnitude is approximately equal to the second magnitude, wherein the average weight of the two walks is approximately zero. In accordance with one embodiment, the term "approximately zero" means that the average weight of the two walks is less than about 5% of the absolute magnitude of the weight of either of the two walks.

In yet another embodiment, the walks for each region are performed in groups, wherein each group of walks includes two or more walks. The walks of each group have different signs (i.e., one or more walks of each group have a positive sign and one or more walks of each group have a negative sign). Moreover, the weights/signs of the walks of each group are selected such that the average weight of the walks of each group is zero (or approximately zero). In one embodiment, the term "approximately zero" means that the average weight of the group of walks is less than about 5% of the absolute magnitude of the weight of any of the walks of the group.

Combining both the method for the dynamic allocation of random walks among regions of the Gaussian surface (the first method) and the method of antithetic random walks (the second method) enables the calculation of parasitic capacitance to be completed, on average, twice as fast as a conventional random walk Monte Carlo field solver method. This speed-up is universal across various designs. The first method alone provides a modest speed-up of 20% for default accuracy settings, and a speed-up of about 1.5 times for tightened accuracy settings. The second method along provides an average speed up of about 1.6 times for all accuracy settings.

The above-described methods for controlling random walks in a Monte Carlo field solver to provide for efficient parasitic capacitance calculation can be implemented by one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language or in assembly or machine language, if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

Figure 5:
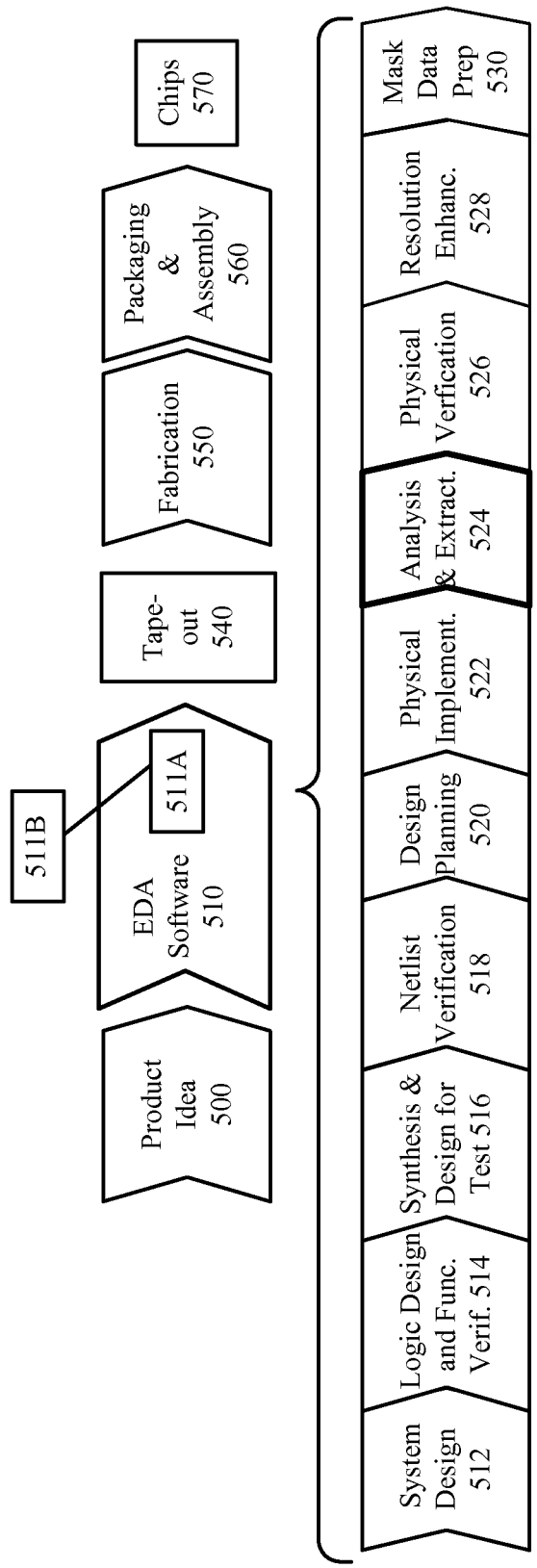
FIG. 5 is a block diagram of a simplified representation of an exemplary digital ASIC design flow including the processes for controlling a random walk Monte Carlo field solver of FIGS. 2A-2B, 3 and 4.

FIG. 5 is a block diagram of a simplified representation of an exemplary digital ASIC design flow including the processes for controlling a random walk Monte Carlo field solver as described above in connection with FIGS. 2A-2B, 3 and 4. At a high level, the process starts with the product idea (step 500) and is realized in an EDA software design process (step 510). When the design is finalized, it can be taped-out (event 540). After tape out, the fabrication process (step 550) and packaging and assembly processes (step 560) occur resulting, ultimately, in finished chips (result 570). In accordance with various embodiments, the above-described methods of: 1) dynamic allocation of random walks from partitioned regions of a Gaussian surface surrounding an origin net, and/or 2) antithetic random walks, can be used in the fabrication process step 550, as part of process development (TCAD) and/or quality control).

The EDA software design process (step 510) is actually composed of a number of steps 512-530, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components/steps of the EDA software design process (step 510) will now be provided. In one embodiment, one or more steps of the EDA software design process can be implemented using a computer-readable medium 511A, which is read by a computer 511B. Note that Astro, AstroRail, CustomSim, ESP, Hercules, IC Compiler, Magellan, Model Architect, Power Compiler, PrimeRail, Proteus, ProteusAF, PSMGen, Saber, StarRC, and System Studio are trademarks of Synopsys, Inc., and CATS, DesignWare, Design Compiler, Formality, HSIM, Leda, NanoSim, Primetime, Syndicated, TetraMAX, VCS, and Vera are registered trademarks of Synopsys, Inc. System design (step 512): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect™, Saber™, System Studio™, and DesignWare® products.

Logic design and functional verification (step 514): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include HSIM®, NanoSim®, CustomSim™, VCS®, VERA®, DesignWare®, Magellan™, Formality®, ESP™ and LEDA® products.

Synthesis and design for test (step 516): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler™, Tetramax®, and DesignWare® products.

Netlist verification (step 518): At this step, the netlist is checked for compliance with timing constraints and for correspondence with the VHDL/Verilog source code. Exemplary EDA software products from Synopsys, Inc. that can be used at this step include Formality®, PrimeTime™, and VCS® products.

Design planning (step 520): Here, an overall floorplan for the chip is constructed and analyzed for timing and top-level routing. Exemplary EDA software products from Synopsys, Inc. that can be used at this step include Astro™ and IC Compiler™ products. In accordance with various embodiments, the above-described methods of: 1) dynamic allocation of random walks from partitioned regions of a Gaussian surface surrounding an origin net, and/or 2) antithetic random walks, can be used in design planning step 520.

Physical implementation (step 522): The placement (positioning of circuit elements) and routing (connection of the same) occurs at this step. Exemplary EDA software products from Synopsys, Inc. that can be used at this step include the Astro™ and IC Compiler™ products.

Analysis and extraction (step 524): At this step, the circuit function is verified at a transistor level, this in turn permits what-if refinement. Exemplary EDA software products from Synopsys, Inc. that can be used at this step include Astro-Rail™, PrimeRail™, Primetime®, and Star RC/XT™ products. In accordance with various embodiments, the above-described methods of: 1) dynamic allocation of random walks from partitioned regions of a Gaussian surface surrounding an origin net, and/or 2) antithetic random walks, can be used in step 524. In accordance with one embodiment, a computer readable medium stores instructions, which when executed by a processor, will implement the above-described method(s) for controlling the random walks of a Monte Carlo field solver, thereby determining the parasitic capacitance of one or more nets of an IC design. If one or more of the determined parasitic capacitances is outside of a desired range, then the original IC design can be modified in order to change the parasitic capacitances. The above-described method(s) for controlling the random walks of a Monte Carlo field solver can then be applied to the modified IC design, thereby determining the parasitic capacitances of the nets of the modified IC design. This process can be repeated until all of the calculated parasitic capacitances are within a desired range.

Physical verification (step 526): At this step various checking functions are performed to ensure correctness for: manufacturing, electrical issues, lithographic issues, and circuitry. Exemplary EDA software products from Synopsys, Inc. that can be used at this step include the Hercules™ product.

Resolution enhancement (step 528): This step involves geometric manipulations of the layout to improve manufacturability of the design. Exemplary EDA software products from Synopsys, Inc. that can be used at this step include Proteus™, ProteusAF™, and PSMGen™ products.

Mask data preparation (step 530): This step provides the "tape-out" data for production of masks for lithographic use to produce finished chips. Exemplary EDA software products from Synopsys, Inc. that can be used at this step include the CATS® family of products.

Although illustrative embodiments of the invention have been described in detail herein with reference to the accompanying figures, it is to be understood that the invention is not limited to those precise embodiments. Thus, the scope of the invention is defined by the following claims and their equivalents.

We claim:

1. A non-transitory computer readable medium that stores instructions, which, when executed, cause a computer to perform a method comprising:

defining a Gaussian surface around an origin net of an integrated circuit (IC) design;

partitioning the Gaussian surface into a plurality of regions;

using a Monte Carlo field solver, performing an initial plurality of random walks from each region, wherein each of the initial plurality of random walks ends on a conductor of the IC design;

dynamically allocating an additional plurality of random walks among the plurality of regions, wherein a number of the additional plurality of random walks allocated to each region is based on a statistical error associated with the initial plurality of random walks performed from the region;

summing results of random walks performed from each of the regions to estimate a parasitic capacitance of the origin net; and using the estimated parasitic capacitance to modify the IC design.

2. The computer readable medium of claim 1, wherein the additional plurality of random walks are allocated among the plurality of regions such that different regions are allocated different numbers of random walks.

3. The computer readable medium of claim 1, wherein the number of additional plurality of random walks allocated to a region increases as the statistical error associated with the initial plurality of random walks performed from the region increases.

4. The computer readable medium of claim 1, wherein the statistical error comprises a standard deviation.

5. The computer readable medium of claim 4, wherein the number of the additional plurality of random walks allocated to each region is proportional to the standard deviation associated with the initial plurality of random walks performed from the region, divided by the sum of the standard deviations associated with the initial plurality of random walks performed from all of the regions.

6. The computer readable medium of claim 1, wherein the additional plurality of random walks comprises a predetermined number of random walks.

7. The computer readable medium of claim 1, further comprising dynamically allocating a second additional plurality of random walks among the plurality of regions, wherein a number of the second additional plurality of random walks allocated to each region is based on a statistical error associated with the additional plurality of random walks performed from the region.

8. The computer readable medium of claim 1, further comprising performing the random walks for each region in pairs, wherein a first random walk of each pair is selected in accordance with a probability function to have a first probability, a first magnitude and a first sign, and wherein a second random walk of each pair is selected to have the first probability, the first magnitude and a second sign, opposite the first sign.

9. The computer readable medium of claim 8, wherein the probability function is anti-symmetric.

10. The computer readable medium of claim 9, wherein the probability function is the electric field Green's function.

11. The computer readable medium of claim 1, further comprising performing an antithetic walk after performing each of the random walks.

12. The computer readable medium of claim 1, further comprising performing the random walks for each region in groups, wherein each of the groups is selected in to have a plurality of walks having different signs and one or more weights, wherein an average weight of the plurality of walks in each of the groups is approximately zero.

13. The computer readable medium of claim 1, further comprising performing the random walks for each region in pairs, wherein a first random walk of each pair is selected to have a first magnitude and a first sign, and wherein a second random walk of each pair is selected to have a second magnitude and a second sign, opposite the first sign, wherein the first magnitude is approximately equal to the second magnitude.

14. A non-transitory computer readable medium that stores instructions, which, when executed, cause a computer to perform a method comprising:
    defining a Gaussian surface around an origin net of an integrated circuit (IC) design;
    using a Monte Carlo field solver, performing pairs of random walks from the Gaussian surface, wherein each pair of random walks includes:
        a first random walk having a first weight and a first associated sign defined by a probability function; and
        a second random walk having the first weight and a second associated sign, opposite the first associated sign, defined by the probability function;
    summing results of the first and second random walks to estimate a parasitic capacitance of the origin net; and
    using the estimated parasitic capacitance to modify the IC design.

15. The computer readable medium of claim 14, wherein the first random walk ends on one of a plurality of conductors of the IC design, and wherein the second random walk ends on one of the plurality of conductors of the IC design, the method further comprising:
    when the first random walk and the second random walk end on a same conductor of the plurality of conductors of the IC design, determining that an average contribution of the first random walk and the second random walk to a mean value of a parasitic capacitance and a variance of the mean value of the parasitic capacitance is zero.

16. The computer readable medium of claim 14, wherein the probability function is anti-symmetric with respect to the Gaussian surface.

17. The computer readable medium of claim 14, wherein the probability function is the electric field Green's function.

18. A non-transitory computer readable medium that stores instructions, which, when executed, cause a computer to perform a method comprising:
    defining a Gaussian surface around an origin net of an integrated circuit (IC) design;
    using a Monte Carlo field solver, performing groups of walks from the Gaussian surface, wherein each group of walks includes two or more walks having weights and signs selected such that the average weight of the walks of each group is approximately zero;
    summing results of the groups of walks to estimate a parasitic capacitance of the origin net; and
    using the estimated parasitic capacitance to modify the IC design.

19. A method comprising:
    using a processor, performing a parasitic capacitance extraction of an integrated circuit (IC) design by:
        defining a Gaussian surface around an origin net of the IC design;
        partitioning the Gaussian surface into a plurality of regions;
        using a Monte Carlo field solver, performing an initial plurality of random walks from each region, wherein each of the initial plurality of random walks ends on a conductor of the IC design;
        dynamically allocating an additional plurality of random walks among the plurality of regions, wherein a number of the additional plurality of random walks allocated to each region is based on a statistical error associated with the initial plurality of random walks performed from the region; and
        summing results of random walks performed from each of the regions to estimate a parasitic capacitance of the origin net; and
    modifying the IC design based on the parasitic capacitance extraction.

20. The method of claim 19, further comprising allocating the additional plurality of random walks among the plurality of regions such that different regions are allocated different numbers of random walks.

21. The method of claim 19, wherein the number of additional plurality of random walks allocated to a region increases as the statistical error associated with the initial plurality of random walks performed from the region increases.

22. The method of claim 19, wherein the statistical error comprises a standard deviation.

23. The method of claim 22, wherein the number of the additional plurality of random walks allocated to each region is proportional to the standard deviation associated with the initial plurality of random walks performed from the region, divided by the sum of the standard deviations associated with the initial plurality of random walks performed from all of the regions.

24. The method of claim 19, wherein the additional plurality of random walks comprises a predetermined number of random walks.

25. The method of claim 19, further comprising dynamically allocating a second additional plurality of random walks among the plurality of regions, wherein a number of the second additional plurality of random walks allocated to each region is based on a statistical error associated with the additional plurality of random walks performed from the region.

26. The method of claim 19, further comprising performing the random walks for each region in pairs, wherein a first random walk of each pair is selected in accordance with a probability function to have a first probability, a first magnitude and a first sign, and wherein a second random walk of each pair is selected to have the first probability, the first magnitude and a second sign, opposite the first sign.

27. The method of claim 26, wherein the probability function is anti-symmetric.

28. The method of claim 27, wherein the probability function is the electric field Green's function.

29. The method of claim 19, further comprising performing an antithetic walk after performing each of the random walks.

30. The method of claim 19, further comprising performing the random walks for each region in groups, wherein each of the groups is selected in to have a plurality of walks having different signs and one or more weights, wherein an average weight of the plurality of walks in each of the groups is approximately zero.

31. The method of claim 19, further comprising performing the random walks for each region in pairs, wherein a first random walk of each pair is selected to have a first magnitude and a first sign, and wherein a second random walk of each pair is selected to have a second magnitude and a second sign, opposite the first sign, wherein the first magnitude is approximately equal to the second magnitude.

32. A method comprising:
using a processor, performing parasitic capacitance extraction of an integrated circuit (IC) design by:
defining a Gaussian surface around an origin net of the IC design;
using a Monte Carlo field solver, performing pairs of random walks from the Gaussian surface, wherein each pair of random walks includes:
a first random walk having a first weight and a first associated sign defined by a probability function; and
a second random walk having the first weight and a second associated sign, opposite the first associated sign, defined by the probability function; and
modifying the IC design based on the parasitic capacitance extraction.

33. The method of claim 32, wherein the first random walk ends on one of a plurality of conductors of the IC design, and wherein the second random walk ends on one of the plurality of conductors of the IC design, the method further comprising:
when the first random walk and the second random walk end on a same conductor of the plurality of conductors of the IC design, determining that an average contribution of the first random walk and the second random walk to a mean value of a parasitic capacitance and a variance of the mean value of the parasitic capacitance is zero.

34. The method of claim 32, wherein the probability function is anti-symmetric with respect to the Gaussian surface.

35. The method of claim 32, wherein the probability function is the electric field Green's function.

* * * * *